United States Patent [19]

Jaffe et al.

[11] 4,135,292
[45] Jan. 23, 1979

[54] INTEGRATED CIRCUIT CONTACT AND METHOD FOR FABRICATING THE SAME

[75] Inventors: James M. Jaffe, Los Altos; Jack I. Penton, Castro Valley, both of Calif.

[73] Assignee: Intersil, Inc., Cupertino, Calif.

[21] Appl. No.: 702,576

[22] Filed: Jul. 6, 1976

[51] Int. Cl.² ............................................. B01J 17/00
[52] U.S. Cl. ...................................... 29/578; 29/589; 29/591; 357/2; 357/65
[58] Field of Search .......................... 29/589, 590, 578; 148/1.5; 357/2, 65

[56] References Cited

U.S. PATENT DOCUMENTS

| | | | |
|---|---|---|---|
| 3,679,947 | 7/1972 | Chakraverty | 357/2 |
| 3,731,372 | 5/1973 | Kraft | 29/590 |
| 3,736,192 | 5/1973 | Tokuyama | 148/1.5 |
| 3,740,835 | 6/1973 | Duncan | 29/590 |

*Primary Examiner*—W. Tupman

[57] ABSTRACT

An integrated circuit aluminum-silicon electrical contact may be fabricated in a diffusion region formed in a monocrystalline silicon semiconductor layer by converting the upper portion of the diffusion region into an amorphous region. Alloy pitting is substantially decreased since the solubility of silicon in aluminum is highly dependent upon crystallographic orientation of the silicon and decreases as the silicon approaches an amorphous form. The amorphous region may be formed by implanting arsenic ions with an energy of at least 180 keV and a dosage of approximately $10^{15}$ ions/cm².

2 Claims, 3 Drawing Figures

INTEGRATED CIRCUIT CONTACT AND METHOD FOR FABRICATING THE SAME

BACKGROUND OF THE INVENTION

1. Field of the Invention

The present invention relates to the field of integrated circuit devices, and in particular to electrical contact pads formed on silicon substrates employing aluminum metalization.

2. Description of the Prior Art

Alloy pitting is a well known phenomena in the integrated circuit arts. When aluminum is alloyed to silicon, within the temperature range of 400° to 500° C., silicon is drawn into the aluminum layer by virtue of the high solid solubility of silicon in aluminum. The prior art has devised various elaborate and esoteric methodologies and structures to deal with this phenomenon in aluminum-silicon contact pads. For example, the prior art has devised or employed silicon doped aluminum, platinum-silicide layers, multilayer metallic contacts, silicon gettering layers and so forth.

As a result of the high solubility of silicon in aluminum, unless some offsetting measure is adopted, the aluminum would migrate into the underlying diffusion layer penetrating the junction depletion region and thereby interfering with the efficient operation of the semiconductor device by increasing reverse leakage current. In the extreme case, the aluminum may punch through a shallow diffusion region thereby completely shorting out the diffusion region.

What is needed is a simplified aluminum-silicon contact which may be fabricated without complicated or costly methodologies and which will be characterized by the substantial elimination of alloy pitting, even in shallow diffusion regions.

BRIEF SUMMARY OF THE INVENTION

The present invention is a method step in the fabrication of a metallic contact to a crystalline semiconductor layer. The step comprises converting a selected portion of the crystalline semiconductor layer into an amorphous form so that solubility of semiconductor material from the crystalline semiconductor layer in the metallic material of the metallic contact is substantially decreased.

The selected portion of the crystalline semiconductor layer may be converted into an amorphous form by ion implantation of a dopant having a minimum preselected energy.

The resulting structure is an integrated circuit contact in a crystalline semiconductor layer comprising an amorphous region disposed in a selected upper portion of the crystalline semiconductor layer. A metallic layer is disposed on at least the amorphous region.

DETAILED DESCRIPTION OF THE PREFERRED EMBODIMENTS

Figure 1:
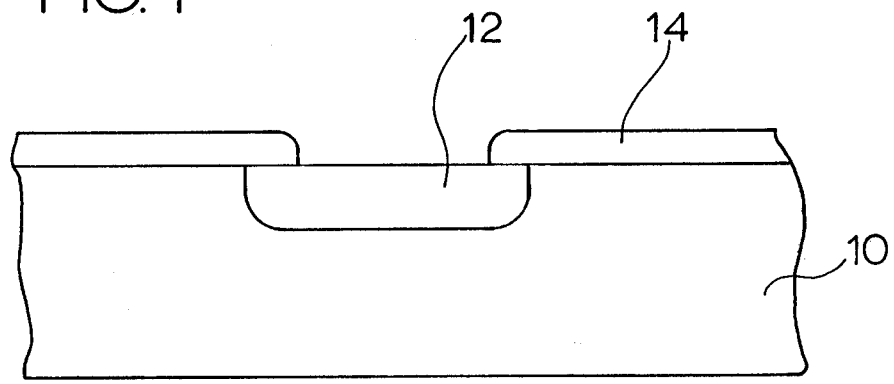
FIG. 1 is a cross sectional view of a semiconductor layer having a diffusion region disposed therein.

The present invention is an improved electrical contact to a monocrystalline silicon substrate having a normal with a preselected crystallographic orientation. An insulating layer may be disposed upon the silicon substrate. The insulating defines an opening in order to expose a selected portion of the surface of the silicon substrate. A first dopant is selectively disposed into the silicon substrate to form a diffusion region. A second dopant is selectively implanted into the diffusion region with a specified minimum energy and dosage to form an amorphous region in the upper portion of the diffusion region. Finally, a layer of metalization is disposed upon the amorphous region of the diffusion region. The amorphous region is characterized as being resistant to the formation of semiconductor-metal alloy pits. The various embodiments of the present invention may be better understood in connection with the description of FIGS. 1-3.

The integrated circuit contact of the present invention is typically formed with a diffusion region 12 within a crystalline semiconductor layer 10. Semiconductor layer 10 is, in the preferred embodiment, a monocrystalline silicon substrate, but may include any type of semiconductor layer well known to the art including epitaxial layers disposed on semiconductor or sapphire substrates. Diffusion region 12 may be formed by any means well known to the art, and may have either N or P type conductivity. In the presently described embodiment, diffusion region 12 is an N type diffusion region formed by a standard phosphorous deposition in a P type substrate 10. Insulating layer 14 may include one or more insulating, passivating or masking layers known to the art. In the present illustration insulating layer 14 is shown as a silicon oxide layer.

The solid solubility of silicon in aluminum is highly dependent on the crystallographic orientation of the silicon. Deep holes or "alloy pits" can propagate perpendicularly into a monocrystalline silicon substrate having its normal oriented along the [100] direction. The tendency to pit in the [100] direction is substantially greater than in silicon oriented in the [111] direction. For example, aluminum, alloyed for 20 minutes at 465° C. on a P type monocrystalline having a [100] orientation, will typically exhibit alloy pits having depths of approximately 1.14 microns. Since the [100] orientation is commonly chosen for integrated circuits, alloy pitting can be a substantial problem.

Figure 2:
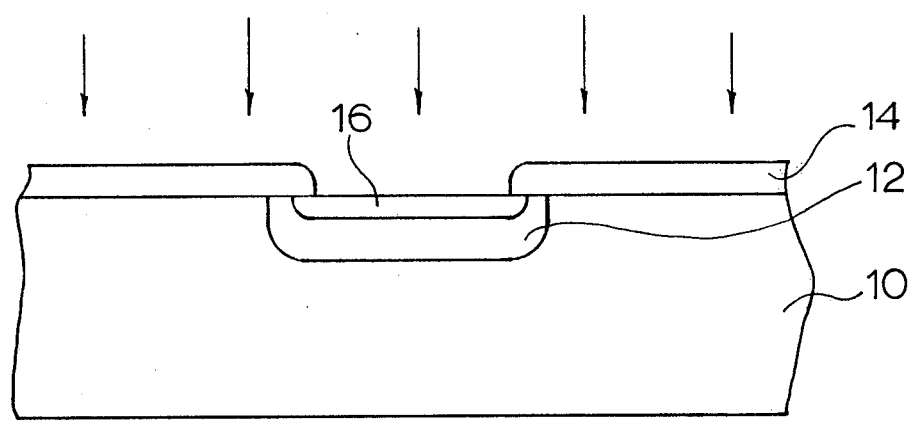
FIG. 2 is cross sectional view of the prepared semiconductor substrate showing the implantation of dopant ions to form an amorphous region within the diffusion region.

FIG. 2 illustrates that prepared substrate 10 is then subjected to an ion implantation according to means well known to the art. According to the present invention, amorphous region 16 is formed in the exposed upper portion of diffusion region 12. The impinging ions have sufficient energy and dosage levels to substantially destroy the crystalline order of the upper portion of diffusion region 12 and convert it into an amorphous form. Throughout the specification, region 16 is denoted as an amorphous region or as assuming an amorphous form. It is to be understood that region 16 need not be truly amorphous, but may only tend to become amorphous, being characterized by a high density of crystallographic disorders.

In the embodiment where a monocrystalline silicon substate, having a [100] orientation, is implanted with arsenic ions, it has been found sufficient that implantation energies approximately equal to or in excess of 180 keV and having a dosage level approximately of the order of $10^{15}$ ions/cm$^2$ form a satisfactory amorphous region 16. For example, the presently preferred embodiment employs a dosage of at least $10^{15}$ ions/cm$^2$ of arsenic at 20 keV using a 100 micro-ampere beam current. The intensity of the beam or dosage rate does not appear to be critical to the formation of amorphous region 16 as long as the heating of substrate 10 by the ion beam is maintained below a safe level. Generally, semiconductor layer 10 can be safely processed at temperatures at or below approximately 600° C. Excessive heating for a prolonged period during implantation could tend to anneal the crystal damage, tend to prevent an amorphous region from completely forming, or interfere with the effect of prior processing steps. At 200 keV and at a beam current of 100 micro-amperes, no special precautions need be taken during normal ion implantation procedures in order to keep the heating of semiconductor layer 10 within a safe level.

It is to be understood that other types of dopants, beam characteristics, diffusion regions and semi-conductor substrates may be subjected to the method of the present invention to fabricate the improved integrated circuit contact. Generally, the dopant need only be of the same conductivity type as the diffusion region. The particular parameters, implantation energy and dosage will be determined by the nature of the dopant, the substrate selected, and substrate temperature, each having a typical ion implantation energy and dosage at which an amorphous region will be formed.

Figure 3:
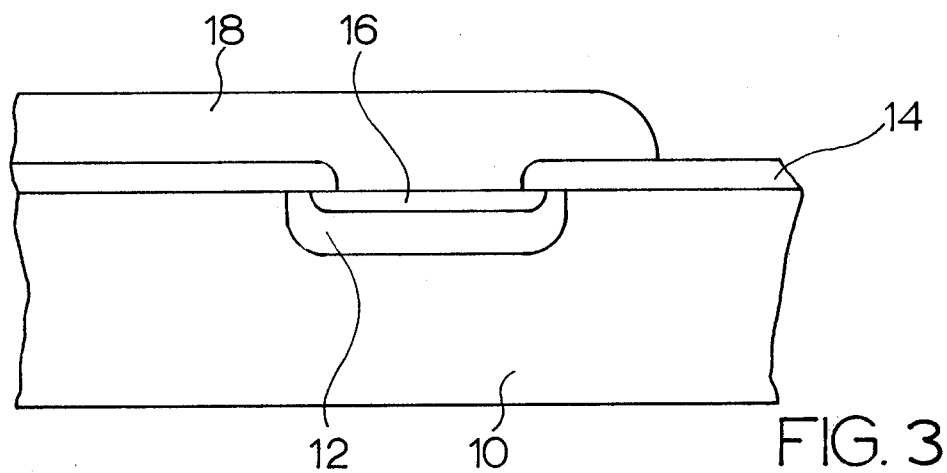
FIG. 3 is a cross sectional view of the prepared substrate after a layer of metalization has been disposed on the amorphous region.

The ion implantation is not driven into or subjected to any further heat or annealing treatments other than that which may occur during normal metalization processes illustrated in FIG. 3. In FIG. 3, a metalization layer 18 is disposed by means well known to the art at least on amorphous region 16. In the preferred embodiment metalization layer 18 is a layer of aluminum. Since metalization layer 18 is disposed upon amorphous region 16, alloy pitting is substantially inhibited and prevented. In the illustrated embodiment semiconductor layer 10 is maintained at a temperature between 400° to 500° C. during the deposition and alloying of aluminum layer 18. Any temperature within this range, such 465° C., is sufficient to alloy aluminum layer 18 with amorphous region 16. However, amorphous region 16 remains sufficiently amorphous to prevent aluminum migration along any crystal planes which may remain in amorphous region 16.

The values of contact resistance of integrated circuit contact pads fabricated according to the present invention have surprisingly low ohmic values. For example, linear resistances of approximately 25 ohms were measured in a contact pad of the present invention along a vertical direction into amorphous region 16. Although it is incompletely understood whether epitaxial recrystallization occurs, as described in Gibbons, "Ion Implantation In Semiconductors — Part II: Damage Production And Annealing", IEEE, Vol. 60, No. 9, September 1972, at pp 1062–1096 or whether an aluminum-silicon alloy is formed to give amorphous region 16 a low resistance, alloy pitting is substantially reduced without increasing contact resistance. For example, an aluminum layer disposed upon P type semi-conductor material, having a crystallographic orientation along the [100] for 20 minutes at 465° C. according to standard prior art techniques resulted in a multiplicity of alloy pits typically having a depth of 1.14 microns. Clearly, the standard metallization diffusion process is unsuitable for shallow junctions having depths of the order of 1.2 microns where aluminum migration may cause unacceptable reverse leakage by penetrating the junction depletion region or in some cases completely punching through the diffusion region to short the diffusion region to the underlying substrate. In constrast, aluminum disposed upon an equivalent type of silicon substrate, oriented along the [100] direction for 20 minutes at 465° C. according to the present invention only allowed the formation of alloy pits having a maximum depth of 0.23 microns or less.

Although the present invention has been particularly illustrated with respect to [100] monocrystalline silicon in which an arsenic implant having an energy of at least 180 keV has been disposed, it is to be understood that the present invention may not be so narrowly construed and that additional modifications and alterations may be made in the presently disclosed integrated circuit contact and method for fabricating the same by those having ordinary skill in the art without departing from the spirit and scope of the present invention.

I claim:

1. A method for forming an electrical contact to a diffusion region within a monocrystalline semiconductor layer comprising the steps of:

converting a selected upper portion of said diffusion region of said semiconductor layer into an amorphous form by implanting ions into said semiconductor layer, said ions having a predetermined minimum energy; and disposing a metallic layer at least on said semiconductor layer in contact with said upper portion of said diffusion region having said amorphous form, wherein said monocrystalline semiconductor layer is a silicon substrate having a [100] crystallographic orientation;

wherein said diffusion region has an N type of conductivity;

wherein said ion implanted amorphous upper portion has said N type of conductivity;

wherein said implanted ions are arsenic ions implanted into said upper portion of said semiconductor layer with an energy of approximately 180 keV with an implantation dosage of approximately $10^{15}$ ions/cm$^2$; and said metallic layer is of aluminum.

2. A method for forming an electrical contact to a monocrystalline silicon substrate having a normal with a crystallographic orientation along the [100] direction comprising the steps of:

selectively disposing an insulating layer on said silicon substrate to define an opening in said insulating layer so as to expose a selected portion of the surface of said silicon substrate;

disposing a first N-type dopant into said selected portion of said silicon substrate to form a diffusion region;

decreasing the solid solubility of said selected portion of said silicon substrate by converting at least part of said selected portion to an amorphous form by selectively implanting a second N-type dopant into said diffusion region with an energy of at least 180 keV and dosage of at least $10^{15}$ ions/cm$^2$ at a preselected substrate temperature in the range of 400–500° C.; and selectively disposing an aluminum layer at least on said amorphous region of said diffusion region, said amorphous region being characterized as resistant to the formation of silicon-aluminum alloy pits.

* * * * *